United States Patent
Teramoto et al.

(10) Patent No.: US 8,284,088 B2
(45) Date of Patent: Oct. 9, 2012

(54) DIGITAL TO-ANALOG CONVERTER

(75) Inventors: Kohei Teramoto, Tokyo (JP); Tsuyoshi Nakada, Tokyo (JP); Seiki Suzuki, Tokyo (JP); Takahisa Aoyagi, Tokyo (JP); Jun Yoshida, Hyogo (JP); Ryoichi Hamahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 126 days.

(21) Appl. No.: 13/057,716

(22) PCT Filed: Oct. 2, 2009

(86) PCT No.: PCT/JP2009/005114
§ 371 (c)(1),
(2), (4) Date: Feb. 4, 2011

(87) PCT Pub. No.: WO2010/061513
PCT Pub. Date: Jun. 3, 2010

(65) Prior Publication Data
US 2011/0169679 A1  Jul. 14, 2011

(30) Foreign Application Priority Data
Nov. 28, 2008  (JP) ................................ 2008-303677

(51) Int. Cl.
*H03M 1/66* (2006.01)
(52) U.S. Cl. ........................................ 341/144; 341/152
(58) Field of Classification Search .................. 341/144, 341/152; 330/10, 251
See application file for complete search history.

(56) References Cited

U.S. PATENT DOCUMENTS

| | | | |
|---|---|---|---|
| 5,021,788 A * | 6/1991 | Ueki et al. | 341/152 |
| 5,148,168 A * | 9/1992 | Masuda et al. | 341/152 |
| 6,734,725 B2 * | 5/2004 | Masuda et al. | 330/10 |
| 6,853,325 B2 * | 2/2005 | Arizumi et al. | 341/152 |
| 7,132,884 B2 * | 11/2006 | Ohkuri et al. | 330/10 |
| 2004/0263244 A1 | 12/2004 | Masuda et al. | |

FOREIGN PATENT DOCUMENTS

| | | |
|---|---|---|
| JP | 2-165729 A | 6/1990 |
| JP | 9-284107 A | 10/1997 |
| JP | 2003-218647 A | 7/2003 |
| JP | 3562127 B2 | 9/2004 |
| JP | 2004-320134 A | 11/2004 |

OTHER PUBLICATIONS

Takayama et al., "Analysis of PWM Section of MASH 1-bit DAC and Device Characteristics", Radio Gijutsu (Technology) Magazine, Nov. 1990, pp. 162-168.

\* cited by examiner

*Primary Examiner* — Khai M Nguyen
(74) *Attorney, Agent, or Firm* — Birch, Stewart, Kolasch & Birch, LLP

(57) ABSTRACT

A complementary pulse width modulation circuit is composed of a signal generating circuit 10 for generating first and second pulse width modulation signals (PWM#1 and PWM#2) that are complementary to each other from an input signal (IN) in response to a sampling synchronous signal (Sample) generated in synchronization with a clock (CLK); and a signal output circuit 20 for combining a positive signal and a negative signal of the first pulse width modulation signal (PWM#1) generated by the signal generating circuit, and for combining the first pulse width modulation signal (PWM#1) combined with the second pulse width modulation signal (PWM#2), followed by outputting.

2 Claims, 6 Drawing Sheets

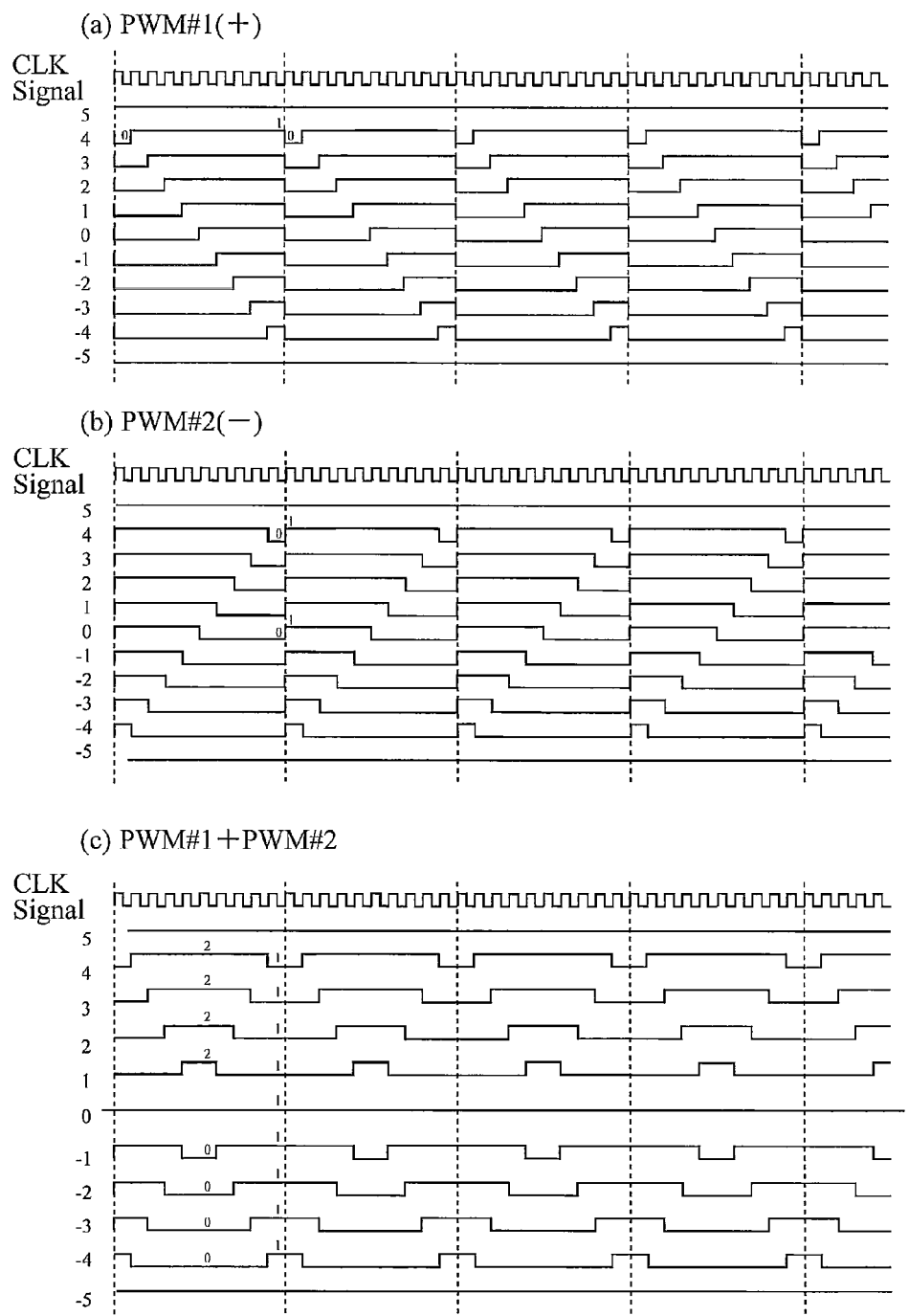

DIGITAL TO-ANALOG CONVERTER

TECHNICAL FIELD

The present invention relates to a digital-to-analog converter suitable for digital audio devices in particular.

BACKGROUND ART

Digital-to-analog converters (referred to as DACs (Digital-to-Analog Converters) from now on) used for digital audio devices can be broadly divided into two types: 1-bit DACs used widely from low-end machines to quality machines; and multi-bit DACs employed by quality machines.

A multi-bit DAC prepares elements corresponding to bit weight of input digital data such as a PCM (Pulse Code Modulation) signal by the number of bits, and extracts the sum total as the output of the analog signal. In this case, the sampling frequency becomes a unit time of its operation.

In contrast, a 1-bit DAC has only two types of output voltage (0 or 1 output) and employs a system of expressing the amplitude along a time axis by increasing the unit time of its operation to several hundred times of the sampling frequency. As a sampling system employed by a 1-bit DAC, a $\Delta\Sigma$ (delta-sigma) system has been known. The $\Delta\Sigma$ (delta-sigma) system is a name of a sampling system that carries out higher operation in the time axis direction to perform processing corresponding to multi-bit operation by the 1-bit DAC.

Being different from the multi-bit DAC, since the 1-bit DAC does not use weighting elements, it has higher linearity in micro amplitude. However, since it drives the quantization noise beyond the audio band (20 KHz) by a noise shaping technique, noise in a high-frequency band increases comparatively. The 1-bit DAC usually performs DA conversion of the total of about 16-18 bits by combining with 2 to 4 order noise shaper.

As an example of the noise shaping technique described above, there are a MASH (registered trademark) system and some others, and as an example of the 1-bit DAC system, there are a PWM (Pulse Width Modulation) conversion and some other methods.

The PWM conversion is a technique that varies its output voltage by the pulse width, which outputs a pulse signal with the width corresponding to the values of the input signal. Here, the PWM output waveform includes amplitude components determined according to its pulse width and phase components determined according to its power center. Thus, if the PWM conversion is made in disregard of the phase components, a PWM output waveform whose sampling intervals are random is output, and the output waveform is distorted inevitably.

For this reason, 1-bit DAC PWM circuits have been conventionally proposed which performs control in such a manner that the waveforms of the power centers of the individual PWM output waveforms become identical in the individual intervals to prevent occurrence of distortion (see Non-Patent Document 1 and Patent Document 1, for example).

PRIOR ART

Non-Patent Document

Non-Patent Document 1: T. Takayama, et al. "Analysis of PWM Section of MASH 1-bit DAC and Device Characteristics" Radio Gijutsu (Technology) Magazine, November, 1990, pp. 162-168.

Patent Document

Patent Document 1: Japanese Patent Laid-Open No. 9-284107/1997.

DISCLOSURE OF THE INVENTION

FIGS. 6 (a), (b) and (c) show output waveforms of a complementary PWM circuit used for a conventional $\Delta\Sigma$ 1-bit DAC. FIGS. 6 (a), (b) and (c) show signals generated by the complementary PWM circuit when the input signal is assumed to be 4-bit parallel data (+5 to −5 in two's complement). Specifically, they show two pulse width modulation signals (PWM#1 and PWM#2) that are generated independently of the input signal values and have phase difference of 180 degrees from each other and a combined signal (PWM#1+PWM#2) of them.

As shown in the waveforms of FIGS. 6 (a) and (b), as for the complementary PWM output waveforms (PWM#1 and PWM#2) output from the conventional complementary PWM circuit, the signals are all formed in the same direction, forward or backward, at every period.

Accordingly, trying to increase the PWM wave frequency to improve the performance such as a distortion factor or SN ratio will increase the number of times of switching because the PWM output waveform period is the same as the switching period (two times of switching per period). This will cause switching noise involved in it, and generate undesired radiation and nonlinear distortion in connection with the switching, which is disadvantageous for a countermeasure against EMI (Electro Magnetic Interference).

In addition, since the individual PWM output waveforms do not have their power center at the center of the individual periods, distortion occurs owing to unevenness of the phase component. Although the distortion can be reduced by some degree by combining the two complementary PWM output waveforms as shown in FIG. 6 (c), if variations occur in peak values of the two PWM output waveforms, the power center position of the combined waveform fluctuates, thereby causing distortion. A technique for eliminating the distortion is not described in either Non-Patent Document 1 or Patent Document 1.

The present invention is implemented to solve the foregoing problems. Therefore it is an object of the present invention to provide a digital-to-analog converter capable of reducing the switching noise and improving the performance by achieving a low distortion transfer characteristic that is hardly affected by the variation of the peak values of the PWM output waveforms even if the variation occurs.

To solve the foregoing problems, a digital-to-analog converter in accordance with the present invention has a complementary PWM circuit for generating a first pulse width modulation signal and a second pulse width modulation signal that are complementary to each other from an input signal in response to a sampling synchronous signal with a clock, for combining a positive signal and a negative signal of the first pulse width modulation signal and for outputting two sets of the first pulse width modulation signal combined and the second pulse width modulation signal; a constant current source; a splitting circuit for halving a constant output current supplied from the constant current source; a differential current switch circuit for carrying out switching control of the individual currents halved by the splitting circuit in response to two sets of the first pulse width modulation signal combined and the second pulse width modulation signal output by the complementary PWM circuit; a current combining circuit for combining outputs of the differential current switch circuit; and a current-to-voltage converter for the converting the current the current combining circuit outputs to voltage.

According to the present invention, it combines the positive signal and negative signal of the first pulse width modulation signal, combines the positive signal and negative signal of the second pulse width modulation signal, and superposes the first pulse width modulation signal combined upon the second pulse width modulation signal to be output. Accordingly, it can improve its performance by reducing the switching noise and by achieving the low distortion transfer characteristic which is immune to the influence of the variation of peak values of the PWM output waveform even if the variation occurs.

BRIEF DESCRIPTION OF THE DRAWINGS

FIG. 6 is a waveform diagram showing the operation of a complementary pulse width modulation circuit used for a conventional 1-bit DAC.

BEST MODE FOR CARRYING OUT THE INVENTION

The best mode for carrying out the invention will now be described with reference to the accompanying drawings to explain the present invention in more detail.

Embodiment 1

Figure 1:
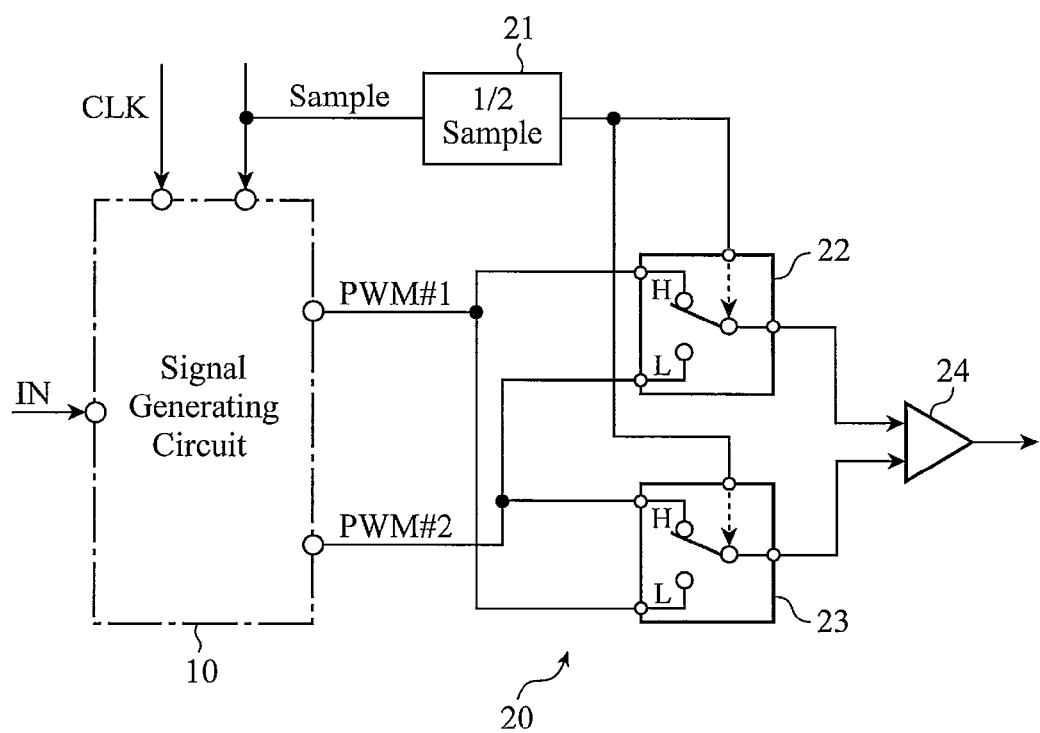
FIG. 1 is a block diagram showing a circuit configuration of a complementary pulse width modulation circuit of an embodiment 1 in accordance with the present invention.

FIG. 1 is a block diagram showing a circuit configuration of a complementary pulse width modulation circuit of an embodiment 1 in accordance with the present invention.

As shown in FIG. 1, the complementary pulse width modulation circuit of the embodiment 1 in accordance with the present invention has in addition to a signal generating circuit 10 working as a signal generating means a signal output circuit 20 comprising a frequency divider circuit 21, selector circuits 22 and 23 and an addition circuit 24.

In the foregoing configuration, the signal generating circuit 10 operates as a signal generating means for "generating a first pulse width modulation signal PWM#1 and a second pulse width modulation signal PWM#2 that are complementary to each other from an input signal IN in response to a sampling synchronous signal generated in synchronization with a clock" and the additional signal output circuit 20 operates as a signal output means for "combining a positive signal and a negative signal of the first pulse width modulation signal PWM#1 generated by the signal generating means, combining a positive signal and a negative signal of the second pulse width modulation signal PWM#2, combining the first pulse width modulation signal PWM#1 and the second pulse width modulation signal PWM#2, and outputting the combination".

Although the internal configuration of the signal generating circuit 10 is not shown here, it comprises at least a timing circuit and two parallel-to-serial converters.

The timing circuit generates a clock signal (CLK) and a sampling synchronous signal (Sample) at timing in synchronization with the input signal (IN), and controls the two parallel-to-serial converters. In response to the sampling synchronous signal (Sample) and the clock signal (CLK) output from the timing circuit, the individual parallel-to-serial converters carry out serial conversion of the inputs, which are supplied to them after converting the input signal (IN) to parallel signals, to the individual pulse width modulation signals (PWM#1 and PWM#2) that are complementary to each other, and supply them to the signal output circuit 20 working as a signal output means.

Incidentally, as for the internal configuration and operation of the conventional signal generating circuit 10, since they are disclosed in detail in the Patent Document 1, for example, further details thereof are omitted to avoid duplication.

On the other hand, the signal output circuit 20 comprises a ½ period divider circuit 21, selector circuits 22 and 23 and an addition circuit 24.

The ½ period divider circuit 21 generates from the sampling synchronous signal (Sample) a ½ period sampling synchronous signal obtained by halving the period of the sampling synchronous signal, and supplies it to the control terminals of the selector circuits 22 and 23.

In addition, the selector circuits 22 and 23 receive the complementary pulse width modulation signals (PWM#1 and PWM#2) from the signal generating circuit 10, select one of the pulse width modulation signals (PWM#1 or PWM#2) in response to the ½ period sampling synchronous signal (½ Sample) supplied to the control terminals and supply to the addition circuit 24. Here, during the positive period of the ½ period sampling synchronous signal (½ Sample), the selector circuits 22 and 23 select and output the positive signal of the first pulse width modulation signal (PWM#1) and the negative signal of the second pulse width modulation signal (PWM#2), respectively, and during the negative period of the ½ period sampling synchronous signal (½ Sample), they select and output the negative signal of the first pulse width modulation signal (PWM#2) and the positive signal of the second pulse width modulation signal (PWM#1), respectively.

Incidentally, the addition circuit 24 combines the first pulse width modulation signal (PWM#1) and the second pulse width modulation signal (PWM#2) output from the selector circuits 22 and 23, and outputs to the outside.

Figure 2:
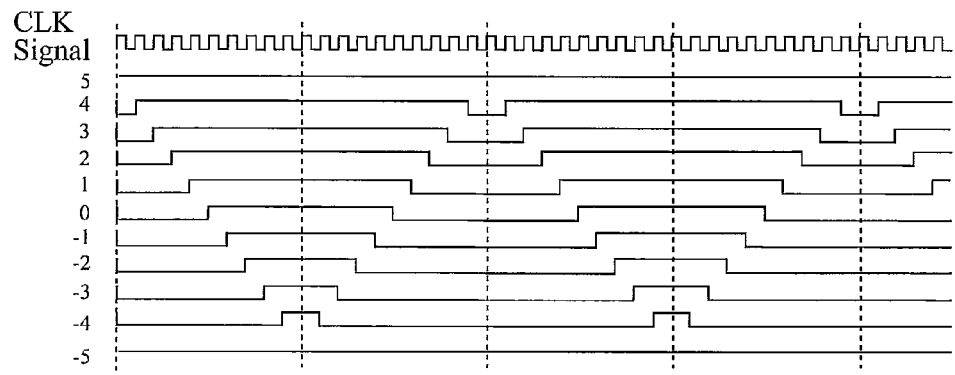
FIG. 2 is a waveform diagram showing the operation of the complementary pulse width modulation circuit of the embodiment 1 in accordance with the present invention.
Figure 2:
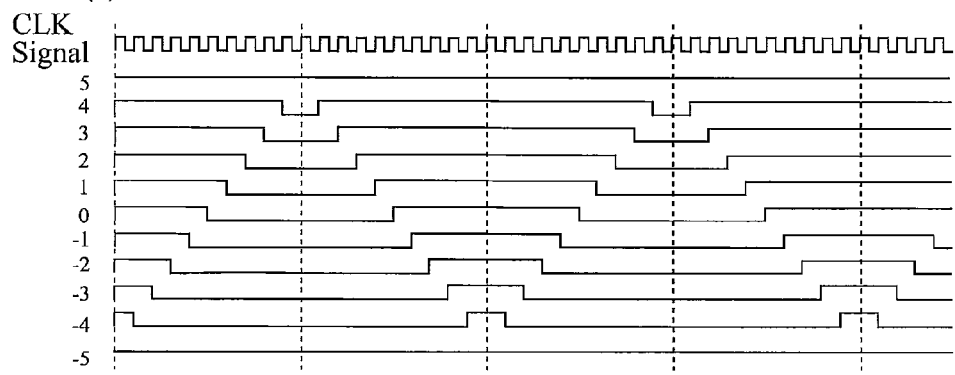
Figure 2:
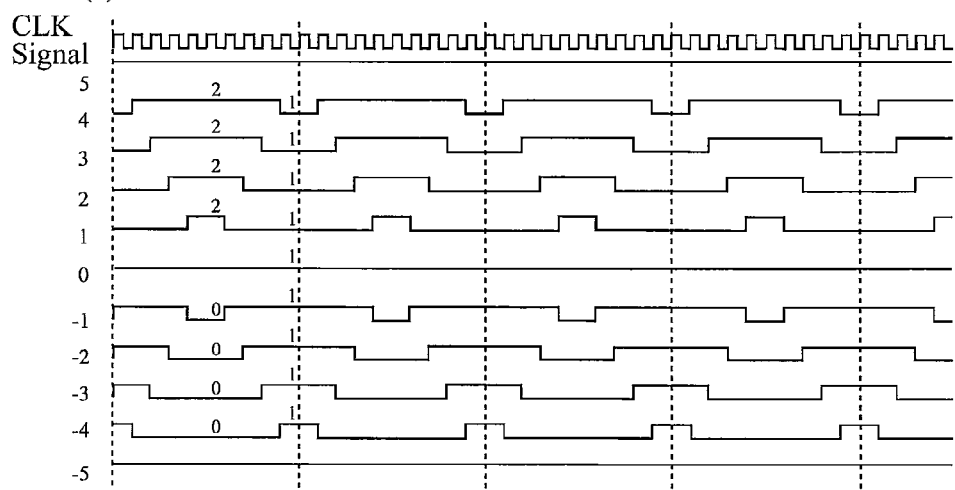

FIG. 2 is a waveform diagram showing the operation of the complementary pulse width modulation circuit of the embodiment 1 in accordance with the present invention. To compare it with the conventional waveform diagram shown in FIG. 6, the input signal is assumed to be a random value from +5 to −5, and FIG. 2 shows a first PWM output waveform (FIG. 2 (a)) and a second PWM output waveform (FIG. 2 (b)) that are complementary to each other, and a combined waveform (FIG. 2 (c)) of the two. Incidentally, as for the algorithm for creating the waveforms of FIG. 2, a variety of methods are conceived, and the complementary pulse width modulation circuit of FIG. 1 is an example of them.

Figure 3:
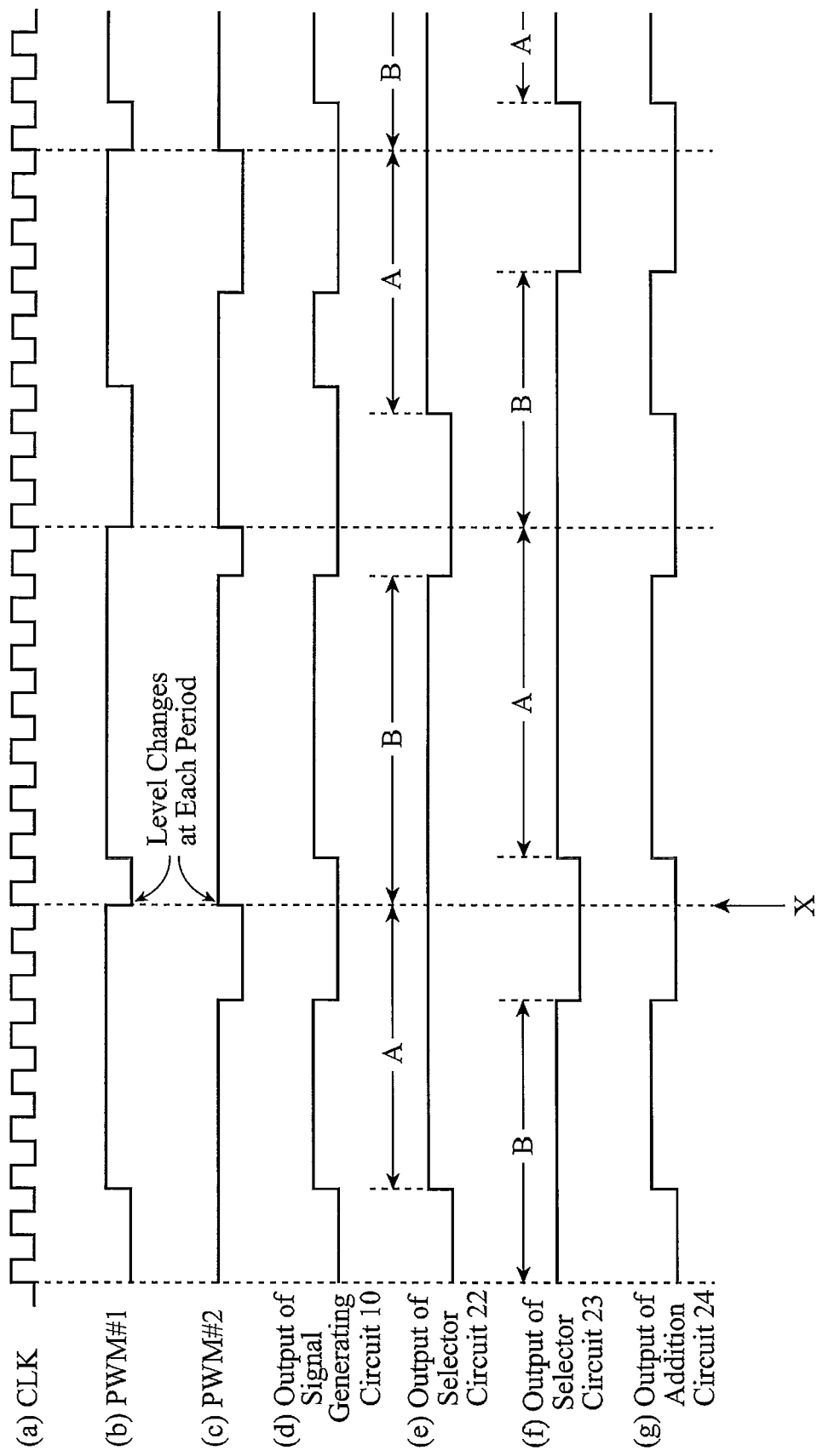
FIG. 3 is a waveform diagram illustrating the operation of the complementary pulse width modulation circuit of the embodiment 1 in accordance with the present invention in more detail.

FIG. 3 is a waveform diagram showing the signal of +3 extracted from them, which shows it in correspondence with the circuit configuration shown in FIG. 1. In FIG. 3, (a) shows the signal waveform of the clock signal (CLK), (b) shows that of the first pulse width modulation signal (PWM#1), (c) shows that of the second pulse width modulation signal (PWM#2), (d) shows that of the output of the signal generating circuit 10, (e) shows that of the output of the selector circuit 22, (f) shows that of the output of the selector circuit 23, and (g) shows that of the output of the addition circuit 24.

The operation of the complementary pulse width modulation circuit of the embodiment 1 in accordance with the present invention will be described in detail below with reference to the waveform diagram of FIG. 3.

As shown in FIGS. 3 (b) and (c), since the signal generating circuit 10 forms both the PWM signals, the first pulse width modulation signal (PWM#1) and the second pulse width modulation signal (PWM#2), from the same direction in each period, the switching operation occurs at the timing (X) across the periods without exception because of the level changes of the signals.

In contrast with this, the complementary pulse width modulation circuit of the embodiment 1 in accordance with the present invention adds to the conventional signal generating circuit 10 the signal output circuit 20. Thus, as shown in FIGS. 3 (e) and (f), according to "High" or "Low" of the ½ period sampling synchronous signal (½ Sample) generated by the ½ period divider circuit 21, the selector circuits 22 and 23 select and output the first pulse width modulation signal (PWM#1) in the first half period A and the second pulse width modulation signal (PWM#2) in the second half period B alternately.

Accordingly, the pulse width modulation signal is formed by selecting the positive PWM output waveform in the first half period and the negative PWM output waveform in the second half period alternately. At this time, as for the output of the selector circuit 22 and the output of the selector circuit 23, since one of them selects and outputs the first pulse width modulation signal (PWM#1) and the other of them selects and outputs the second pulse width modulation signal (PWM#2), the mutually complementary relationship between them can be maintained. In the end, as shown in FIG. 3 (g), the first pulse width modulation signal (PWM#1) and the second pulse width modulation signal (PWM#2) are combined via the addition circuit 24 and output.

Thus, since the foregoing configuration can eliminate the level changes of the signals at the timing (X) across the periods, the switching operation there becomes unnecessary. Accordingly, the number of times of switching can be halved in total equivalently, thereby being able to suppress the undesired radiation involved in the switching and to reduce the distortion occurring from the PWM output waveform itself because the power center becomes approximately constant throughout every previous and following periods.

In addition, even if the two complementary PWM output waveforms have variations in their peak values and do not become constant, one of the PWM output waveforms at least can reduce its distortion and is immune to the variation of the peak values. Accordingly, the present embodiment can provide a complementary pulse modulation circuit with a ΔΣ type 1-bit DAC capable of achieving a low distortion transfer characteristic.

Incidentally, according to the complementary pulse width modulation circuit of the embodiment 1 in accordance with the present invention described above, although only the operation when the +3 signal is input as the input signal is described, it operates in the same manner for any of the signals of +5 to −5 as shown in FIG. 2.

It goes without saying that the input signal is not limited to +5 to −5, and that the present embodiment is applicable to all the input signals determined in accordance with the number of bits of the parallel data input to the complementary pulse width modulation circuit.

Figure 4:
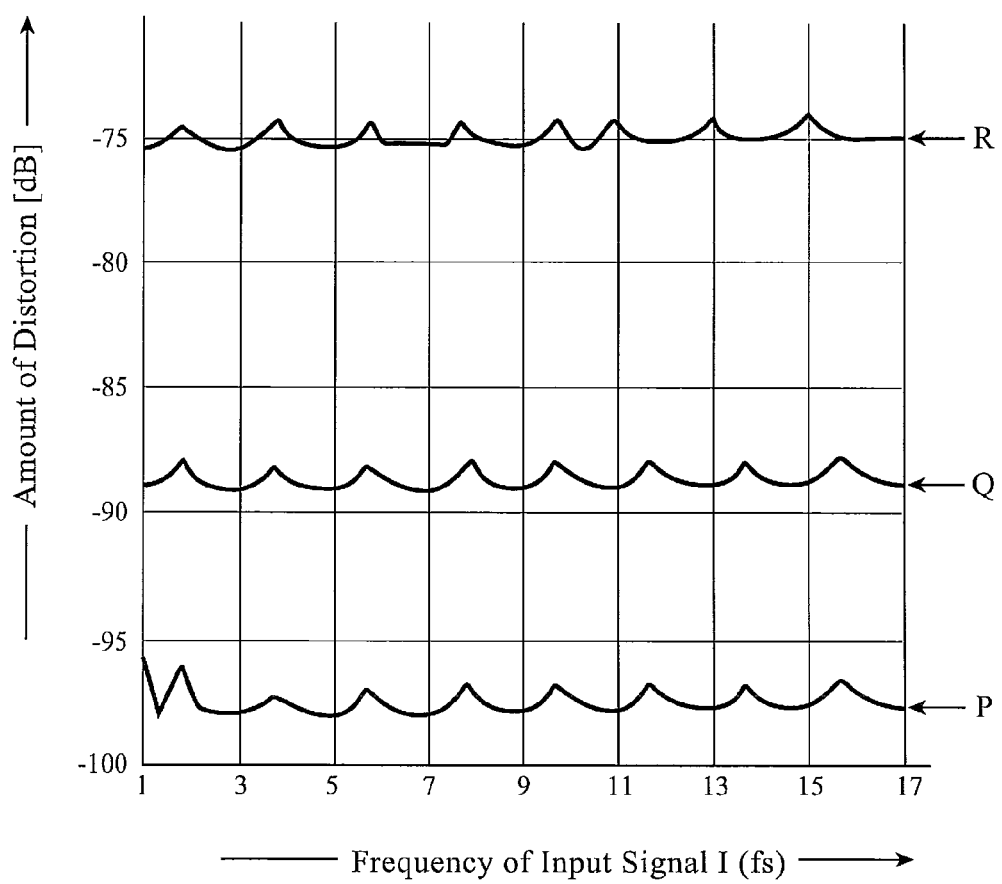
FIG. 4 is a graph showing the performance of the complementary pulse width modulation circuit of the embodiment 1 in accordance with the present invention in comparison with that of a conventional complementary pulse width modulation circuit.

FIG. 4 is a diagram showing advantages of the complementary PWM circuit of the embodiment 1 in accordance with the present invention in comparison with the conventional complementary PWM circuit on a graph in which the vertical axis shows the distortion [dB] contained in the PWM output waveform and the horizontal axis shows the frequency [fs] of the input signal according to a program that derives a theoretical equation and calculates a distortion spectrum from the PWM output waveform.

As indicated by a mark P in the graph of FIG. 4, it is found that the complementary pulse width modulation circuit of the embodiment 1 in accordance with the present invention can reduce the distortion sharply as is clear from the comparison with the conventional complementary PWM circuit with a pair error of 2% as indicated by a mark Q, and that as indicated by a mark R, in particular, it can reduce the distortion by 20 dB or more in comparison with the conventional complementary PWM circuit with the pair error of 10%.

According to the complementary pulse width modulation circuit of the embodiment 1 in accordance with the present invention described above, it comprises the signal generating circuit 10 for generating the first pulse width modulation signal PWM#1 and second pulse width modulation signal PWM#2 that are complementary to each other from the input signal (IN) in response to the sampling synchronous signal (Sample) generated in synchronization with the clock signal (CLK); and the signal output circuit 20 for combining the positive signal (first half period A) with the negative signal (second half period B) of the first pulse width modulation signal generated, and for combining the first pulse width modulation signal combined with the second pulse width modulation signal combined and for outputting. Thus, it can reduce the switching noise because of the reduction of the number of times of switching, and achieve the low distortion transfer characteristic that is immune to the influence of variation even if the variation occurs in the peak values of the PWM output waveforms, thereby being able to provide a complementary pulse width modulation circuit capable of improving the performance.

Embodiment 2

Figure 5:
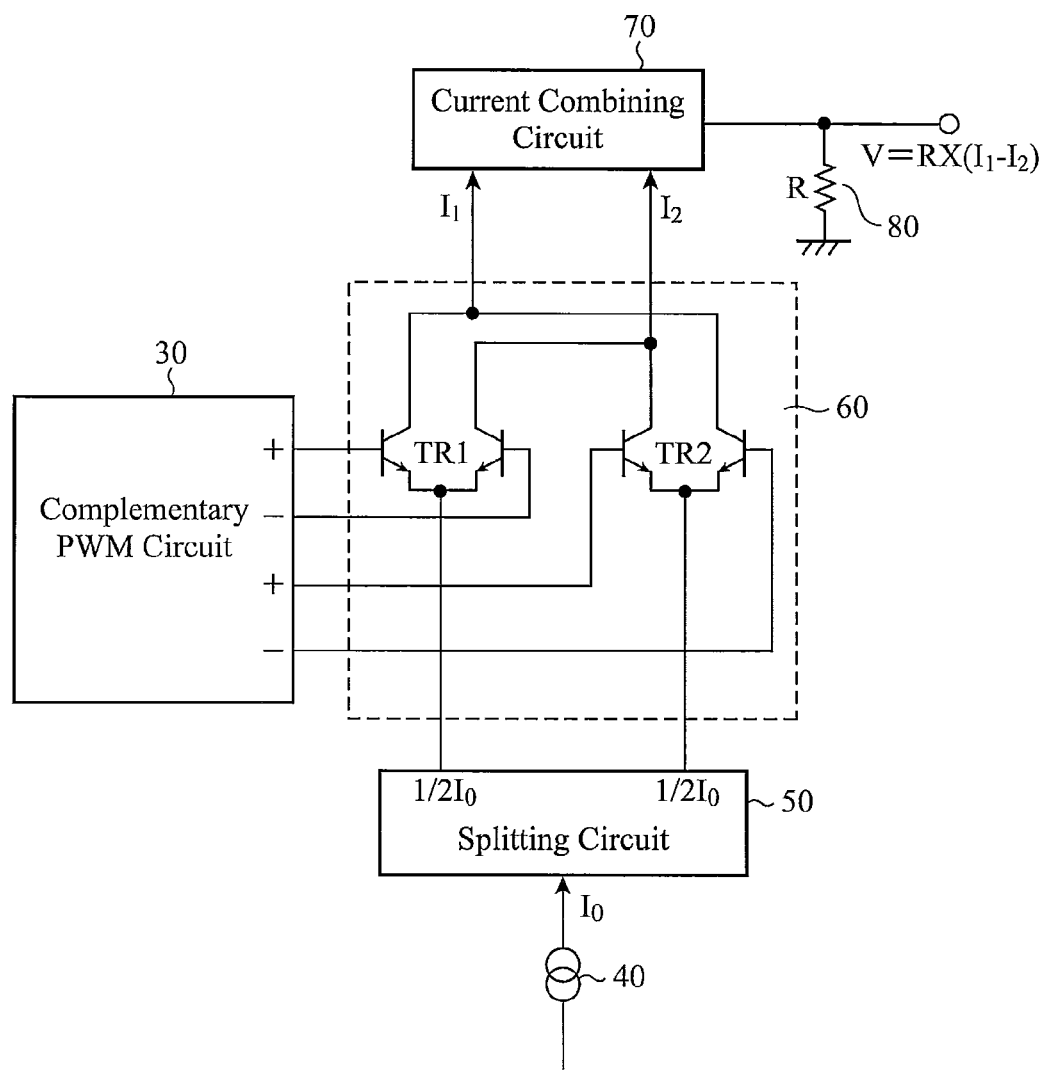
FIG. 5 is a block diagram showing a circuit configuration of a digital-to-analog converter of an embodiment 2 in accordance with the present invention.

FIG. 5 is a block diagram showing a circuit configuration of a digital-to-analog converter of an embodiment 2 in accordance with the present invention.

As shown in FIG. 5, the digital-to-analog converter of the embodiment 2 in accordance with the present invention comprises a constant current source 40; a splitting circuit 50 for halving a constant output current supplied from the constant current source 40; a complementary PWM circuit (ΔΣ 1-bit DAC) 30 for generating first and second pulse width modulation signals that are complementary to each other from the input signal in response to the sampling synchronous signal synchronized with the clock, for combining the positive signal and negative signal of the first pulse width modulation signal generated, and for outputting two sets of the first pulse width modulation signal combined and the second pulse width modulation signal; a differential current switch circuit 60 including current switches (TR1 and TR2) for carrying out switching control of the currents, which are obtained by halving the current by the splitting circuit 50, in response to the two sets of the first pulse width modulation signal and second pulse width modulation signal output from the complementary PWM circuit 30; a current combining circuit 70 for combining the outputs of the individual current switches (TR1 and TR2) of the differential current switch circuit 60; and a current-to-voltage converter 80 for converting the current the current combining circuit 70 outputs to voltage.

The constant current source 40 is a circuit for supplying a fixed output current $I_0$ to the splitting circuit 50. The constant current source 40 can be a variable constant current source.

In addition, the splitting circuit 50 is a circuit for dividing the output current $I_0$ with a fixed value supplied from the constant current source 40 into two equal parts (½ $I_0$) and for supplying them to the differential current switch circuit 60. The differential current switch circuit 60 is a current switch that undergoes switching control by two sets consisting of the first pulse width modulation signal and the second pulse width modulation signal supplied from the complementary PWM circuit 30. At this time, the complementary PWM circuit 30 combines the positive signal and the negative signal of the first pulse width modulation signal (PWM#1) generated by the signal output circuit 20, and then supplies the differential current switch circuit 60 with the two sets of the first pulse width modulation signal (+) combined and the second pulse width modulation signal (−) complementary to the first pulse width modulation signal, thereby controlling the switching of the current switches TR1 and TR2 constituting the differential current switch circuit 60.

The current combining circuit 70 is a circuit that combines the outputs $I_1$ and $I_2$ of the differential current switch circuit 60, which carries out switching control of the individual currents halved through the splitting circuit 50, and that supplies the combined current to the current-to-voltage converter 80.

In addition, the current-to-voltage converter 80 is a circuit that converts the current output by the current combining circuit 70 to voltage (V=R×($I_1$−$I_2$)), and supplies it to an analog circuit not shown.

As described above, the digital-to-analog converter of the embodiment 2 in accordance with the present invention has the differential current switch circuit 60 connected after the two sets of the PWM circuit outputs that are complementary to each other and are included in the complementary PWM circuit 30, and the differential current switch circuit 60 undergoes the switching control by the two sets of the PWM signals.

The DC output $I_0$ generated by the single constant current source 40 is halved by the splitting circuit 50, and the individual currents (½ $I_0$) undergo the switching control by the differential current switch circuit 60. Then, the current combining circuit 70 combines the outputs of the individual current switches TR1 and TR2 constituting the differential current switch circuit 60, and the current-to-voltage converter 80 converts it to the voltage value V and outputs to the analog circuit not shown.

As for the two sets of the PWM circuit outputs of the complementary PWM circuit 30, when there is no input signal, complementary square waves with 50% duty are formed, and when there is the input signal, they are formed in such a manner that an increase of the duty of a first PWM output is equal in the absolute value to a decrease of the duty of a second PWM output.

Accordingly, forming the two equal constant currents from the constant current output from the constant current source 40 by the splitting circuit 50 and combining by the current combining circuit 70 the two constant currents after switching them in response to the switching signals consisting of the complementary PWM outputs will create the combined current consisting of only the DC component when there is no input signal. Thus, the influence that the jitter superposed upon the complementary PWM circuit 30 is mixed into the analog signal output after the DA conversion is reduce. In addition, even if variation arises in the two equal constant currents generated by the splitting circuit 50, the distortion in the signal combined and output by the current combining circuit 70 is reduced because of the switching in response to the complementary PWM outputs.

With the foregoing configuration, the digital-to-analog converter can set the combined current value of the differential outputs of the individual current switches TR1 and TR2 of the differential current switch circuit 60 output from the current combining circuit 70 at the constant DC current (½ $I_0$) when there is no input signal, and increases the signal in accordance with the magnitude of the changes in the duty, thereby exerting the influence of the jitter superposed upon the reference clock of the complementary PWM circuit 30 in proportion to the signal level.

Accordingly, it can reduce the nonlinear distortion or noise due to the jitter. As a result, it can provide the digital-to-analog converter that has improved its performance by reducing the switching noise and by achieving the low distortion transfer characteristic which is immune to the influence of the variation in peak values of the PWM output waveform even if the variation occurs.

INDUSTRIAL APPLICABILITY

The complementary pulse modulation circuit and digital/analog device in accordance with the present invention can improve the performance by reducing the switching noise and by achieving the low distortion transfer characteristic which is immune to the influence of the variation in peak values of the PWM output waveform even if the variation occurs. As a result, it is suitably used for the complementary pulse width modulation circuit and digital-to-analog converter appropriate to the digital audio device.

What is claimed is:

1. A digital-to-analog converter comprising:
   a complementary PWM circuit for generating a first pulse width modulation signal and a second pulse width modulation signal that are complementary to each other from an input signal in response to a sampling synchronous signal synchronized with a clock, for combining a positive signal and a negative signal of the first pulse width modulation signal, and for outputting two sets of the first pulse width modulation signal combined and the second pulse width modulation signal;
   a constant current source;
   a splitting circuit for halving a constant output current supplied from the constant current source;
   a differential current switch circuit for carrying out switching control of the individual currents halved by the splitting circuit in response to two sets of the first pulse width modulation signal combined and the second pulse width modulation signal output by the complementary PWM circuit;
   a current combining circuit for combining outputs of the differential current switch circuit; and
   a current-to-voltage converter for the converting the current the current combining circuit outputs to voltage.

2. The digital-to-analog converter according to claim 1, wherein the two sets of the output signals of the complementary PWM circuit constitute, when the input signal is inactive, 50% duty square waves that are complementary to each other, and constitute, when the input signal is active, output signals in such a manner that an increase in duty of one of the output signals is equal in an absolute value to a decrease in duty of the other of the output signals.

* * * * *